US011086366B2

(12) United States Patent
Huston et al.

(10) Patent No.: US 11,086,366 B2
(45) Date of Patent: Aug. 10, 2021

(54) USER-SERVICEABLE DIMENSIONALLY-CONSTRAINED DEVICE

(71) Applicant: Microsoft Technology Licensing, LLC, Redmond, WA (US)

(72) Inventors: David John Huston, Seattle, WA (US); Eugene Lee, Kenmore, WA (US); Scott Douglas Bowers, Woodinville, WA (US); David Michael Lane, Sammamish, WA (US); Brian David Bitz, Woodinville, WA (US); Thomas Joseph Longo, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/562,327

(22) Filed: Sep. 5, 2019

(65) Prior Publication Data
US 2021/0072799 A1 Mar. 11, 2021

(51) Int. Cl.
*G06F 1/16* (2006.01)
*H05K 5/02* (2006.01)

(52) U.S. Cl.
CPC ......... *G06F 1/1656* (2013.01); *H05K 5/0221* (2013.01); *H05K 5/0234* (2013.01)

(58) Field of Classification Search
CPC ... G06F 1/1613; G06F 1/1626; H05K 5/0221; H05K 13/0015
See application file for complete search history.

(56) References Cited

U.S. PATENT DOCUMENTS

| 3,734,342 | A | * | 5/1973 | Patterson | H02G 3/081 220/3.94 |
| 5,483,418 | A | * | 1/1996 | Hosoi | G06F 1/1616 361/679.55 |
| 5,550,712 | A | * | 8/1996 | Crockett | H05K 7/142 174/564 |
| 5,848,718 | A | * | 12/1998 | Colwell | H02G 3/081 220/4.02 |
| 6,375,026 | B1 | * | 4/2002 | Sheldrake | H04M 1/0249 220/4.02 |

(Continued)

FOREIGN PATENT DOCUMENTS

CN 2569211 Y 8/2003
CN 107479650 A 12/2017
(Continued)

OTHER PUBLICATIONS

"International Search Report and Written Opinion Issued in PCT Application No. PCT/US20/038289", dated Nov. 26, 2020, 15 pages.

*Primary Examiner* — Adrian S Wilson
(74) *Attorney, Agent, or Firm* — Rainier Patents, P.S.

(57) ABSTRACT

The description relates to devices, such as user-serviceable dimensionally-constrained devices. One example can include a first portion and a corresponding second portion. The example can also include a gap reduction assembly positioned along edges of the first portion and the second portion that biases the first and second portions toward one another. The example can also include an alignment assembly that laterally aligns corners of the first portion and the second portion and a locking assembly that locks the aligned corners of the first portion and the second portion against one another.

20 Claims, 10 Drawing Sheets

(56) References Cited

U.S. PATENT DOCUMENTS

| | | | | |
|---|---|---|---|---|
| 6,532,152 | B1* | 3/2003 | White | G02F 1/133308 361/692 |
| 6,560,119 | B1* | 5/2003 | Katsuyama | G06F 1/183 174/138 D |
| 6,717,799 | B2* | 4/2004 | Hamano | G06F 1/1616 174/383 |
| 7,417,852 | B2* | 8/2008 | Wong | G06F 1/1656 361/679.55 |
| 8,341,832 | B2* | 1/2013 | Theobald | H05K 5/04 29/825 |
| 8,365,380 | B1 | 2/2013 | Leavy et al. | |
| 8,610,523 | B2* | 12/2013 | Ku | H01F 7/0252 335/219 |
| 8,717,131 | B2* | 5/2014 | Fullerton | H01F 7/0273 335/306 |
| 9,086,852 | B2* | 7/2015 | Johnson | G06F 1/1662 |
| 9,354,663 | B2* | 5/2016 | Lin | G06F 1/1637 |
| 10,154,605 | B1* | 12/2018 | Hartman | G06F 1/16 |
| 10,522,519 | B2* | 12/2019 | Ryu | G09F 9/3026 |
| 2002/0064036 | A1* | 5/2002 | Yano | G02F 1/133308 361/809 |
| 2004/0183762 | A1* | 9/2004 | Kang | G06F 1/1637 345/87 |
| 2004/0190239 | A1* | 9/2004 | Weng | G06F 1/1616 361/679.2 |
| 2005/0018393 | A1* | 1/2005 | Kuo | G06F 1/1679 361/679.58 |
| 2005/0023022 | A1* | 2/2005 | Kriege | G06F 1/1656 174/559 |
| 2005/0151894 | A1* | 7/2005 | Katsuda | G02F 1/133308 349/58 |
| 2006/0002065 | A1 | 1/2006 | Hua | |
| 2007/0103266 | A1* | 5/2007 | Wang | G06F 1/1632 335/285 |
| 2008/0007902 | A1* | 1/2008 | Kim | G06F 1/1616 361/679.08 |
| 2009/0027583 | A1 | 1/2009 | McBroom et al. | |
| 2014/0091686 | A1* | 4/2014 | Pegg | H04M 1/0252 312/222 |
| 2014/0192470 | A1 | 7/2014 | Ho et al. | |
| 2015/0277491 | A1 | 10/2015 | Browning et al. | |
| 2018/0329459 | A1* | 11/2018 | Singla | G06F 1/1679 |
| 2018/0359876 | A1* | 12/2018 | Hartman | H05K 5/0217 |

FOREIGN PATENT DOCUMENTS

| | | |
|---|---|---|
| EP | 1621967 A1 | 2/2006 |
| WO | 2016007177 A1 | 1/2016 |
| WO | 2018199898 A1 | 11/2018 |

* cited by examiner

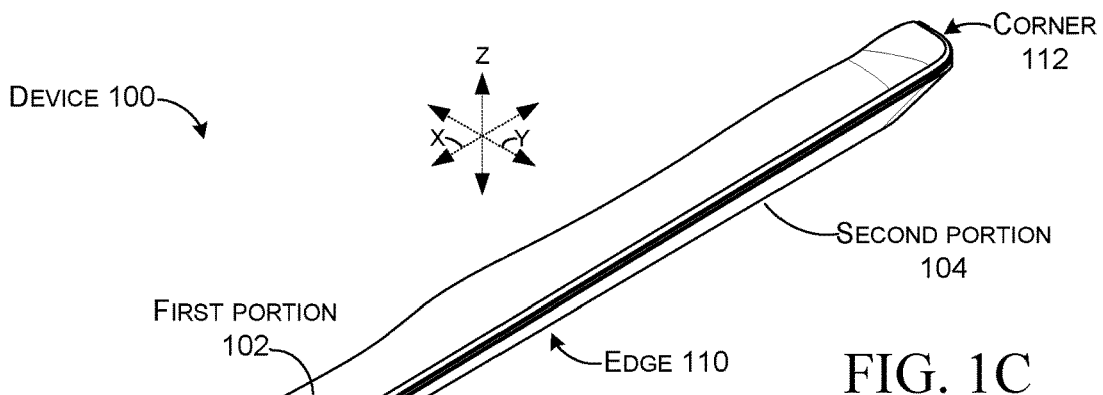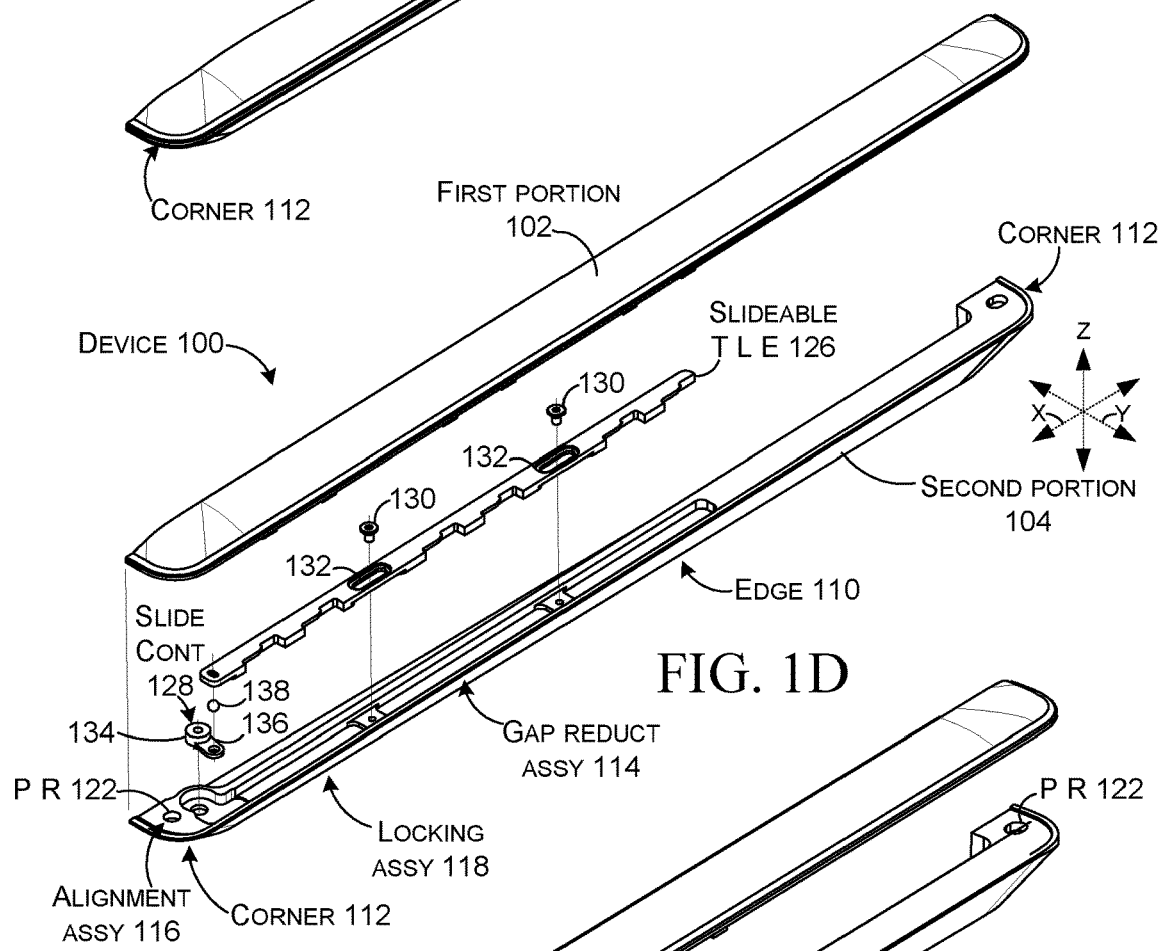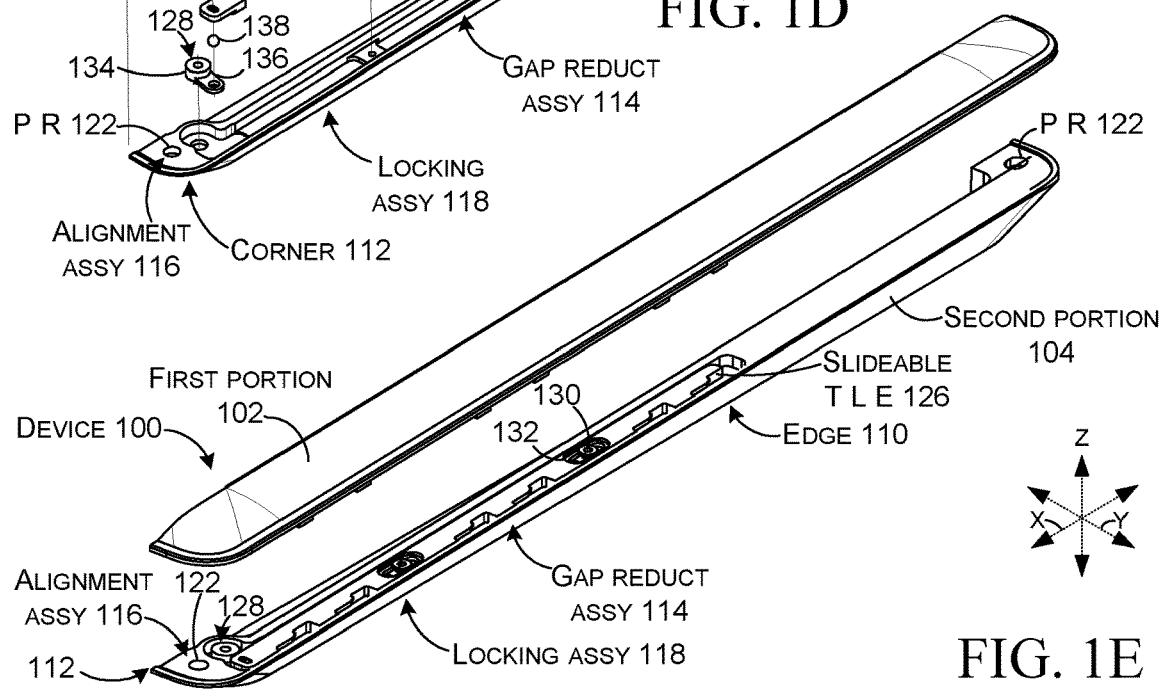

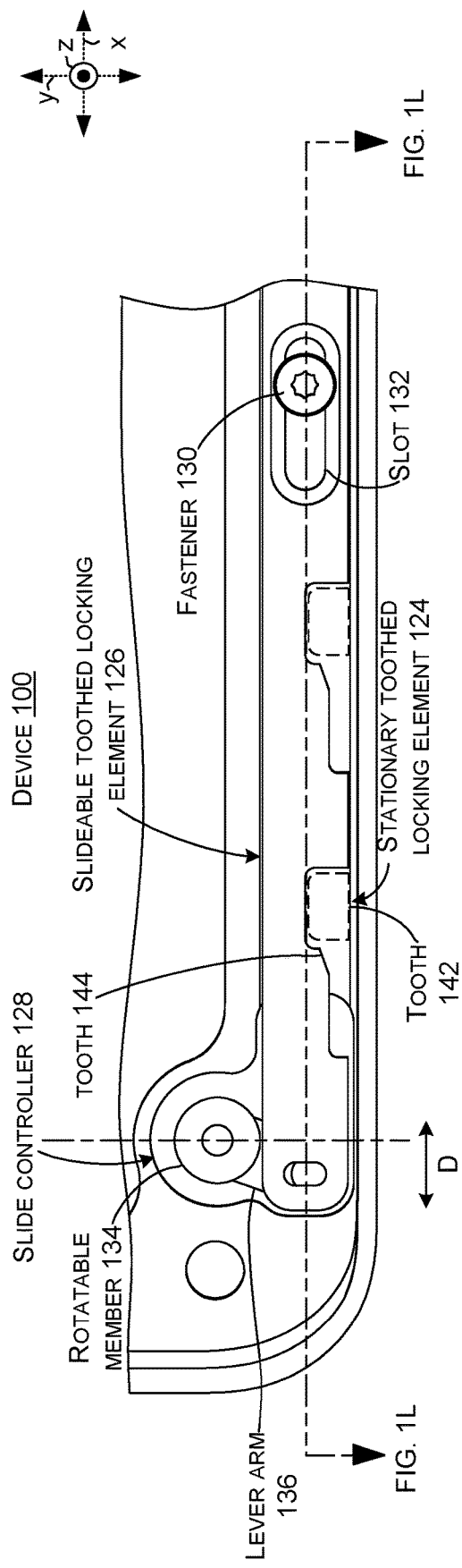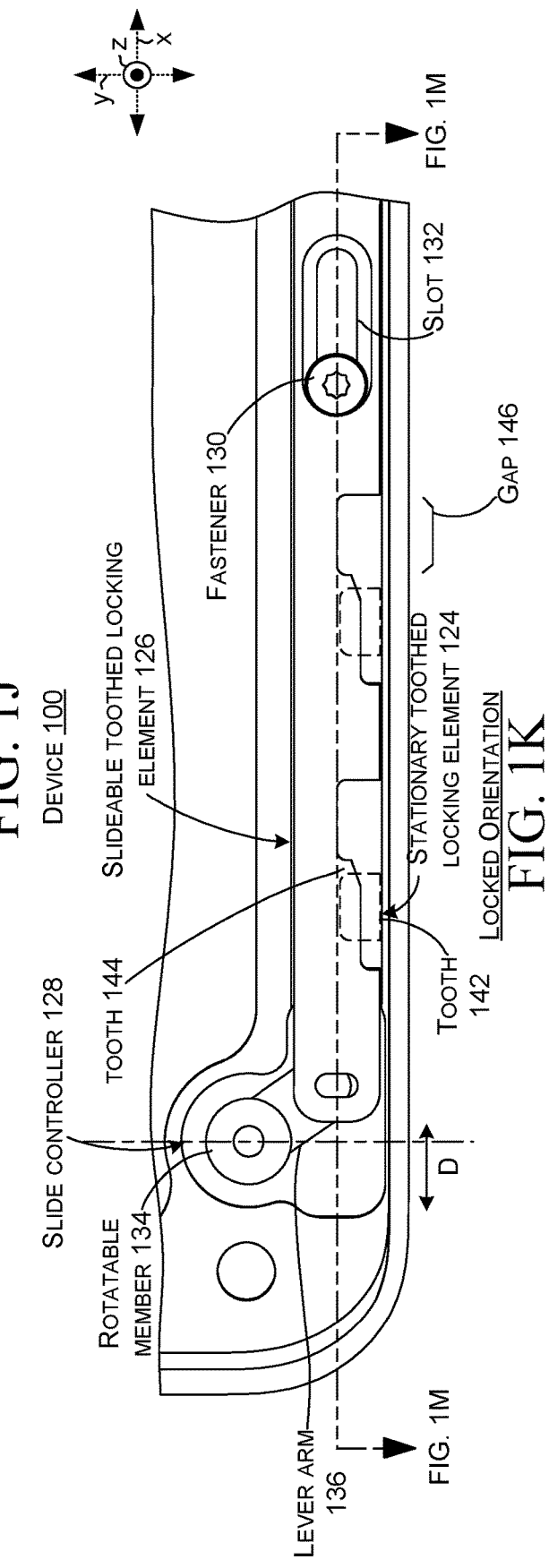

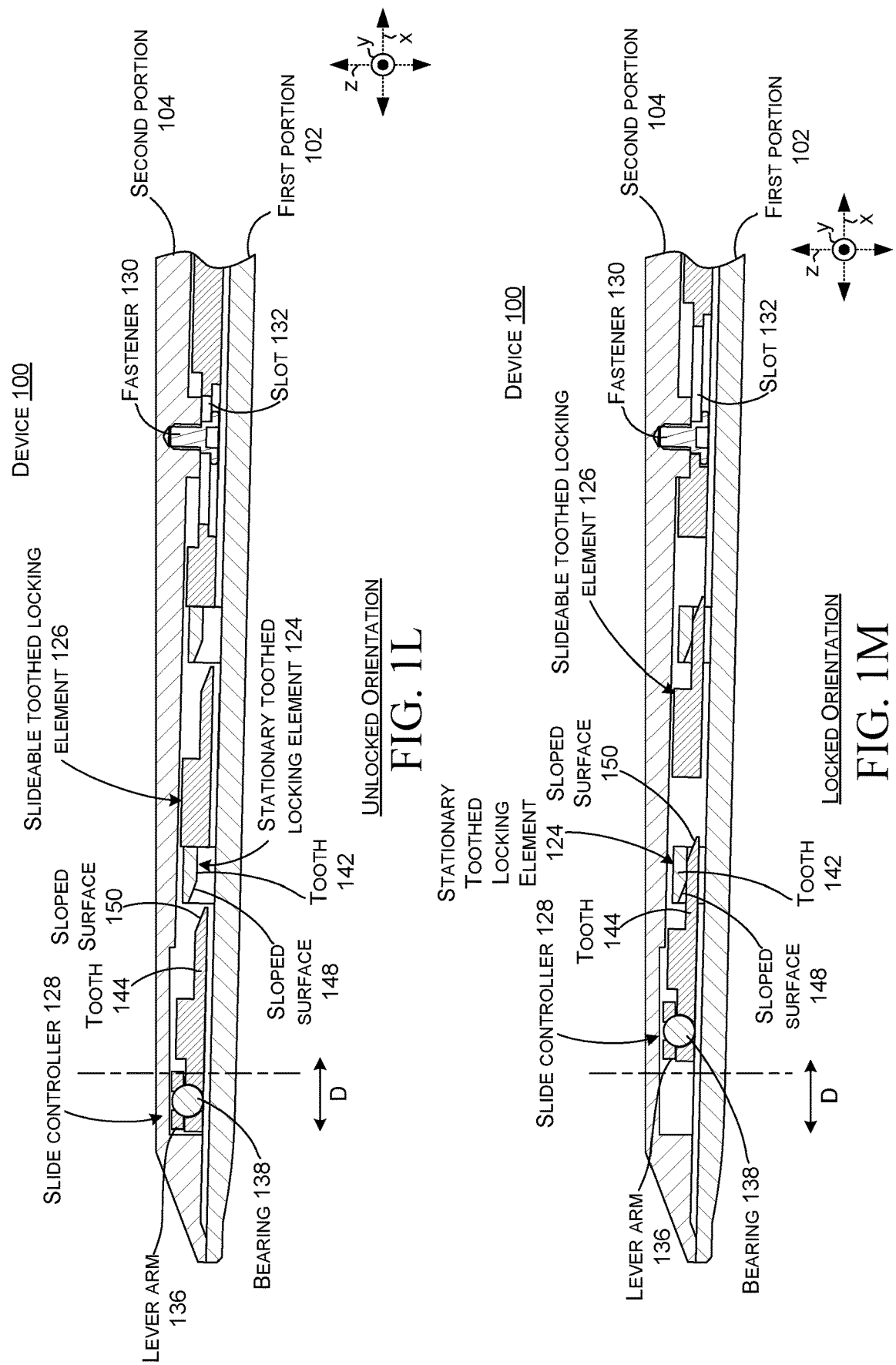

USER-SERVICEABLE DIMENSIONALLY-CONSTRAINED DEVICE

BACKGROUND

The quest for ever thinner devices has led to devices being constructed in a manner that the devices tend to be difficult or impossible to service. This condition diminishes the user experience and can cause user alienation. The present concepts offer both dimensionally constrained solutions and serviceability.

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

FIGS. 1A-1C, 1F, and 2A are perspective views of example user-serviceable dimensionally-constrained devices in accordance with the present concepts.

FIGS. 1D, 1E, 1G, and 2B-2D are exploded perspective views of example user-serviceable dimensionally-constrained devices in accordance with the present concepts.

FIGS. 1H-1K are elevational views of example user-serviceable dimensionally-constrained devices in accordance with the present concepts.

FIGS. 1L, 1M, and 2E are sectional views of example user-serviceable dimensionally-constrained devices in accordance with the present concepts.

DESCRIPTION

The present concepts relate to devices, such as computing devices that can include components positioned in an enclosure or housing. Many computing devices employ a first portion and a corresponding second portion to form the enclosure that holds the components, such as processors, batteries, etc. For many form factors, such as tablets, notebooks, and/or wearable devices, consumer preferences are toward smaller form factors, especially thinner (e.g., z-dimension constraints) and/or lighter form factors. These demands led to devices that were sealed at the factory, often with the device placed in an alignment die or mold that aligned the first and second portions and pressed them together to provide an aesthetically-pleasing form-factor. A special adhesive, such as adhesive tapes was employed in the alignment die to bond the first and second portions. These devices are difficult to service and require special tools, such as heat guns to disassemble the first and second portions. Further, disassembly tends to damage at least the adhesive tape, among other components, such as those to which the adhesive tape is adhered. Thus, reassembly can only be accomplished with special tools and if replacement components, such as adhesive tape is available.

In contrast, the present concepts can satisfy user demands relating to constrained device dimensions while offering a user-serviceable configuration. The user-serviceable configuration can be disassembled and reassembled with commonly available tools and without replacing any components (e.g., no alignment dies and/or no sacrificial components).

Despite this simplicity, the present concepts can offer self-alignment features, gap reduction features, and/or locking features that contribute to offering the same or similar aesthetics in a serviceable form factor.

Figure 1A:
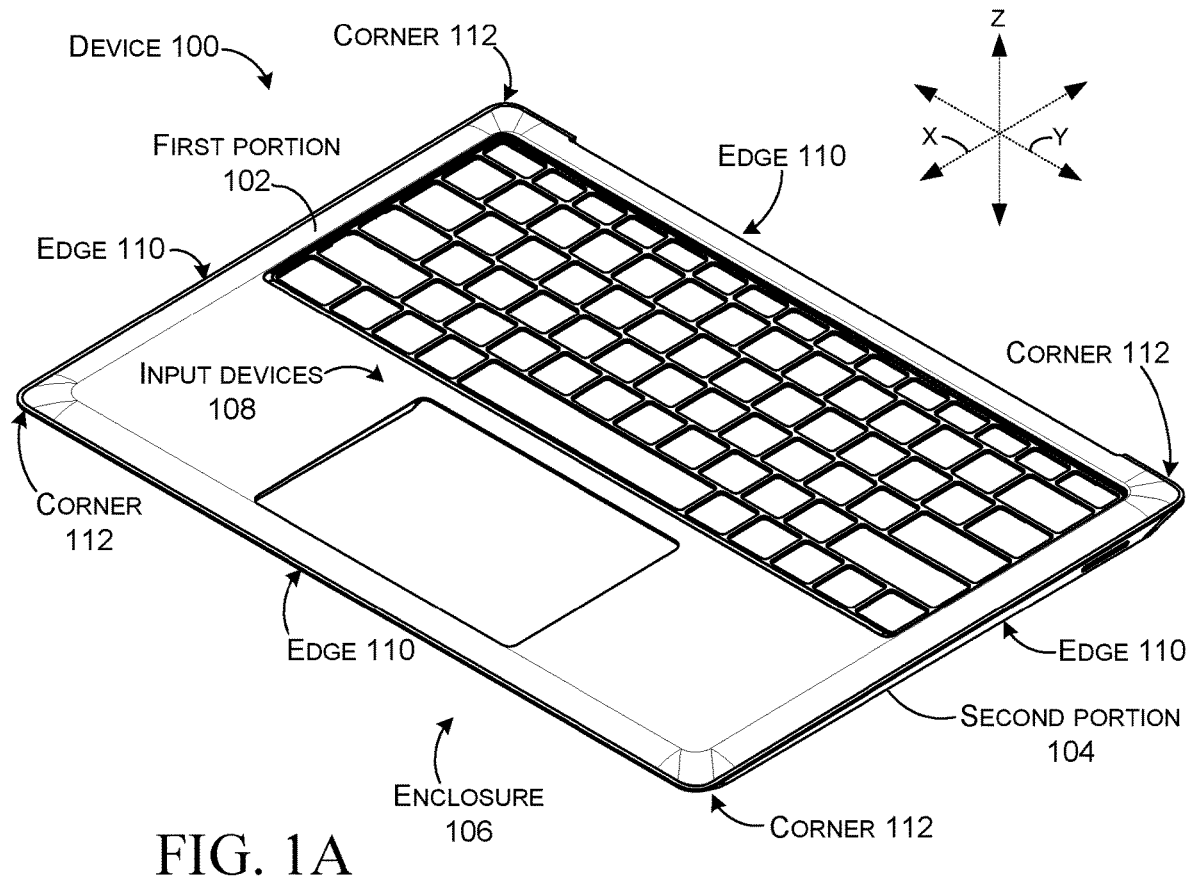
Figure 1B:
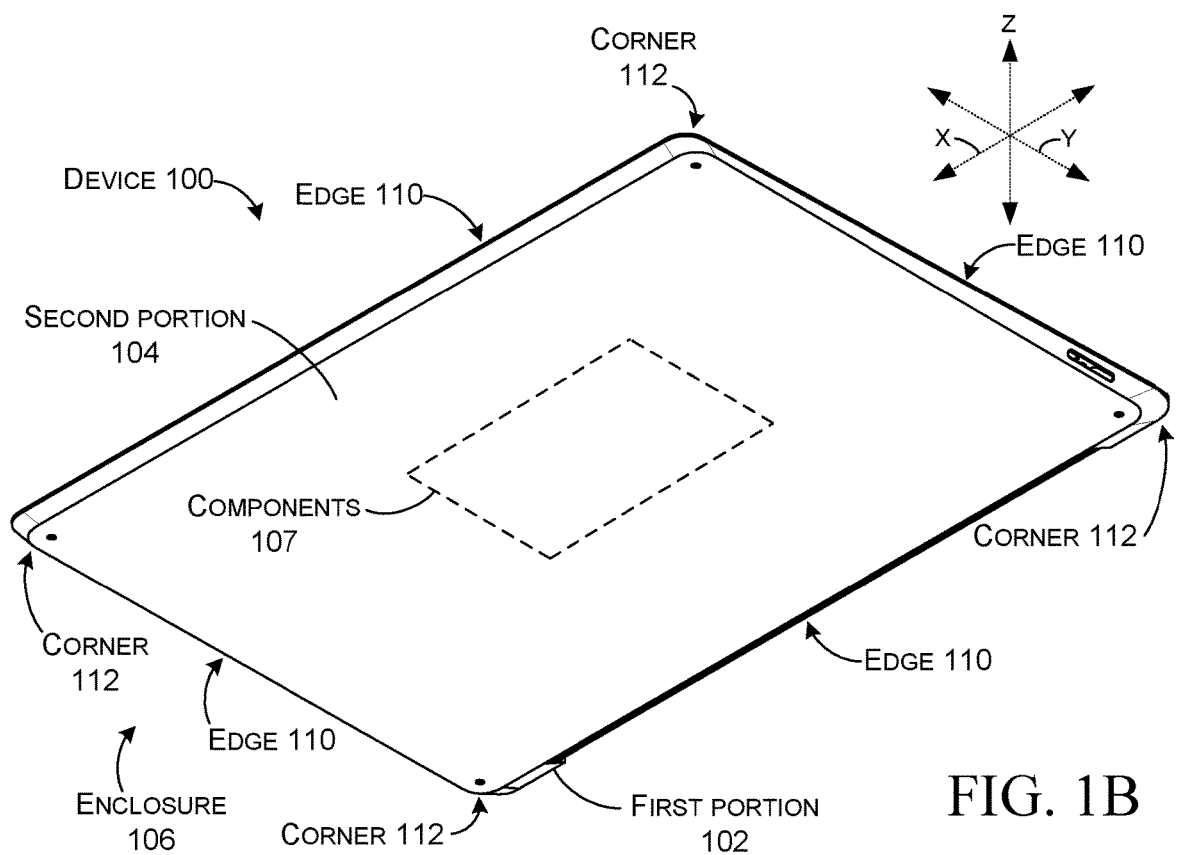
Figure 1F:
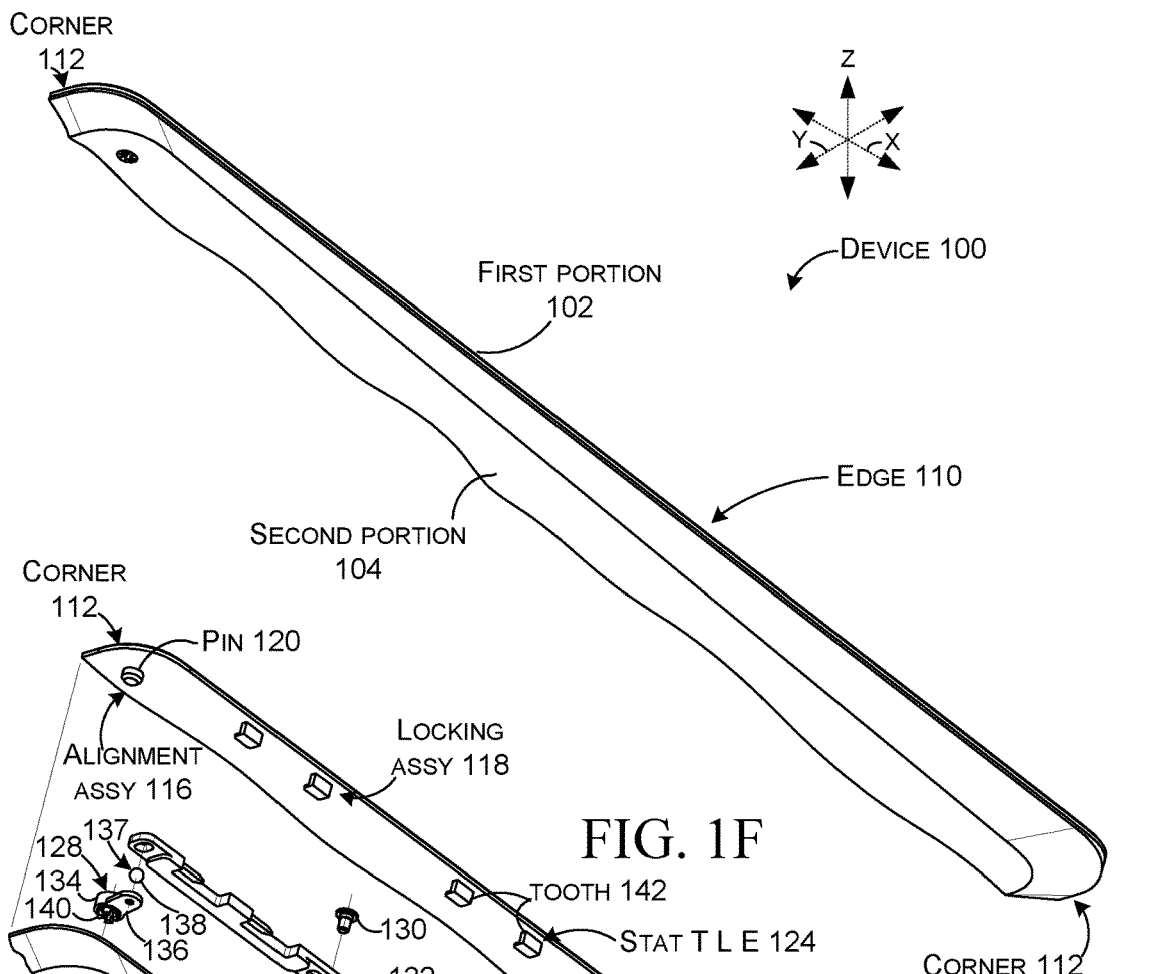
Figure 1G:
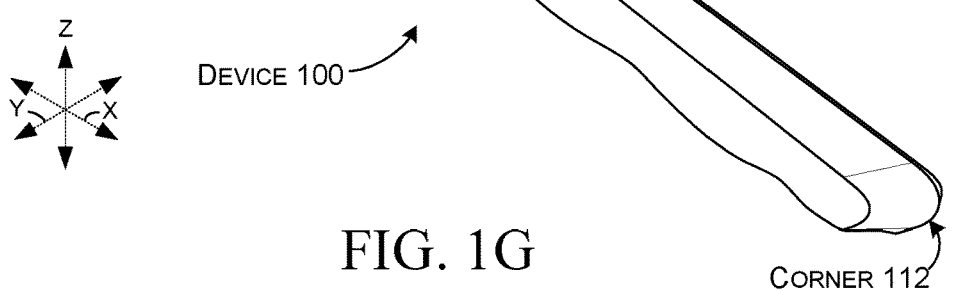

FIGS. 1A-1M collectively show some of the present concepts relative to an example device 100, such as a notebook computer (display region not shown for simplicity). FIGS. 1A and 1B show opposing views of example device 100. FIGS. 1C-1E show views of a region of the device from a similar perspective to FIG. 1A. FIGS. 1F and 1G show views of the region from a similar perspective to FIG. 1B. FIGS. 1H-1K show elevational views of the region. FIGS. 1L and 1M show sectional views of the region.

In this manifestation, device 100 can include a first portion 102 and a second portion 104. The first portion 102 and the second portion 104 can be assembled to collectively form an enclosure 106. Various components 107, such as processors, memory/storage, and/or batteries can be positioned in the enclosure 106. (Components 107 shown in ghost in FIG. 1B to indicate the components may not be visible when the device is assembled). In this example, input devices 108 in the form of a keyboard and a trackpad are positioned on the first portion 102.

In the illustrated version, the first and second portions 102 and 104 can define edges 110 that can meet at corners 112. The first and second portions can include gap reduction assemblies 114, alignment assemblies 116, and/or locking assemblies 118. The gap reduction assemblies 114, alignment assemblies 116, and/or locking assemblies 118 can allow the first and second portions to be readily assembled to form the enclosure 106 around the components 107, disassembled to expose the components, and reassembled without special tools, such as alignment dies, heating guns, etc.

The alignment assemblies 116 can serve to align the corners 112 and edges 110 of the first portion 102 with the corners 112 and edges 110 of the second portion 104 (e.g., automatic alignment in the x and y-reference dimensions). In this case, the alignment assemblies 116 are manifest as alignment pins 120 extending from the corners 112 of the first portion 102 and correspondingly positioned pin receptacles 122 in the second portion 104 (or vice versa (e.g., pins on the second portion and pin receptacles on the first portion)). As the first and second portions are brought toward one another during assembly, the pins 120 can engage the pin receptacles 122. This engagement can further align edges 110 and corners 112 of the first portion 102 with corresponding edges 110 and corners 112 of the second portion 104. Alignment pins 120 can be positioned on every corner of the device or less than all of the corners.

The gap reduction assemblies 114 can serve to reduce any gaps between the first and second portions 102 and 104 when assembled (e.g., in the z-reference dimension) to form the enclosure 106. Elimination of gaps can enhance the aesthetic appeal of the device as well as preventing foreign materials, such as dust from entering the enclosure 106. The locking assemblies 118 can serve to lock the first and second portions together unless or until the user chooses to unlock them, such as to access the components 107.

In this implementation, the gap reduction assemblies 114 and the locking assemblies 118 can include shared elements. For instance, this implementation can employ a stationary toothed locking element 124 in one or more edges 110 of the first portion 102. A slideable toothed locking element 126 and a slide controller 128 can be positioned in one or more corresponding edges 110 of the second portion 104. In this case, the slideable toothed locking element 126 can be slideably secured to the second portion by fasteners 130 that pass through slots 132 in the slideable toothed locking element 126 and can be secured to the second portion 104.

In this example, the stationary toothed locking elements 124 and the slideable toothed locking elements 126 can be positioned on two opposing edges, such as on the sides (proximate to and parallel to the ends of the keyboard), or the top (proximate to the top row of the keyboard) and the bottom (proximate to the touchpad). In other cases, the stationary toothed locking elements 124 and the slideable toothed locking elements 126 can be positioned on more edges, such as three edges or all of the edges, among other configurations.

In this case, the slide controller 128 can include a rotatable member 134 and a lever arm 136. An anti-binding element 137, such as a bearing 138 or other structure, can couple the lever arm 136 and the slideable toothed locking element 126. The anti-binding element 137 can prevent binding between the lever arm 136 and the slideable toothed locking element 126 when rotational force of the lever arm 136 is converted to linear movement of the slideable toothed locking element 126.

The slide controller 128 can include an interface 140 that is engageable by the user with commonly available tools. For instance, the interface 140 could be a Phillips head or Torx head, among others. The user can access the interface 140 with the corresponding tool/driver through the second portion 104 to control the slide controller 128 and thereby lock and unlock the first and second portions 102 and 104. Specifically, in this implementation, the user can rotate the rotatable member 134, which rotates the lever arm 136. The lever arm 136 can act upon the slidable toothed locking element 126 to move the slidable toothed locking element 126 by a distance D relative to the stationary toothed locking element 124. This aspect is described below relative to FIGS. 1H-1M and can be evidenced by comparing FIG. 1H to FIG. 1I, FIG. 1J to FIG. 1K, and FIG. 1L to FIG. 1M.

Figure 1H:
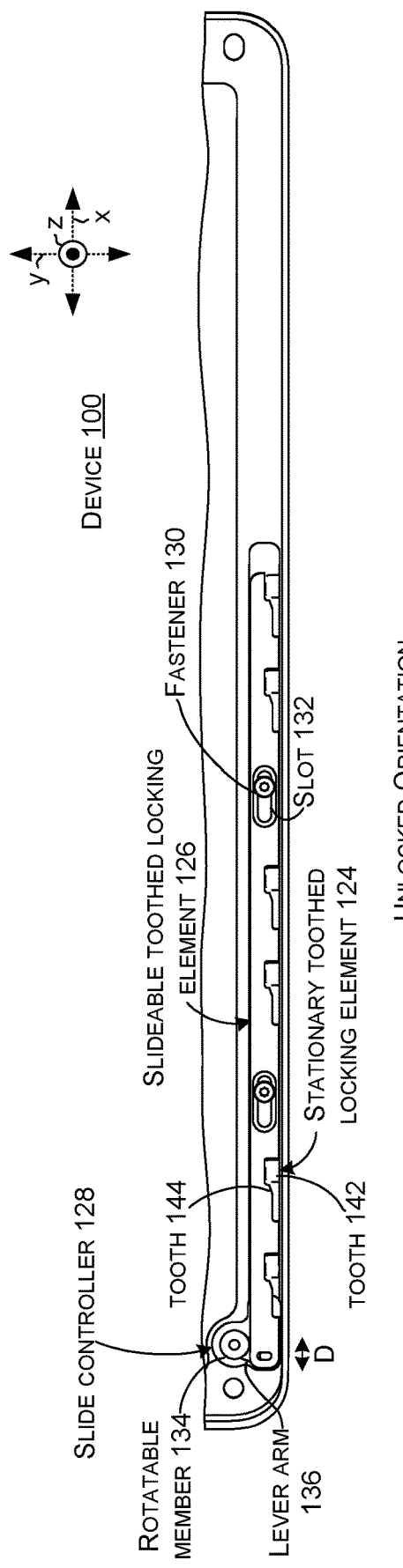
Figure 1I:
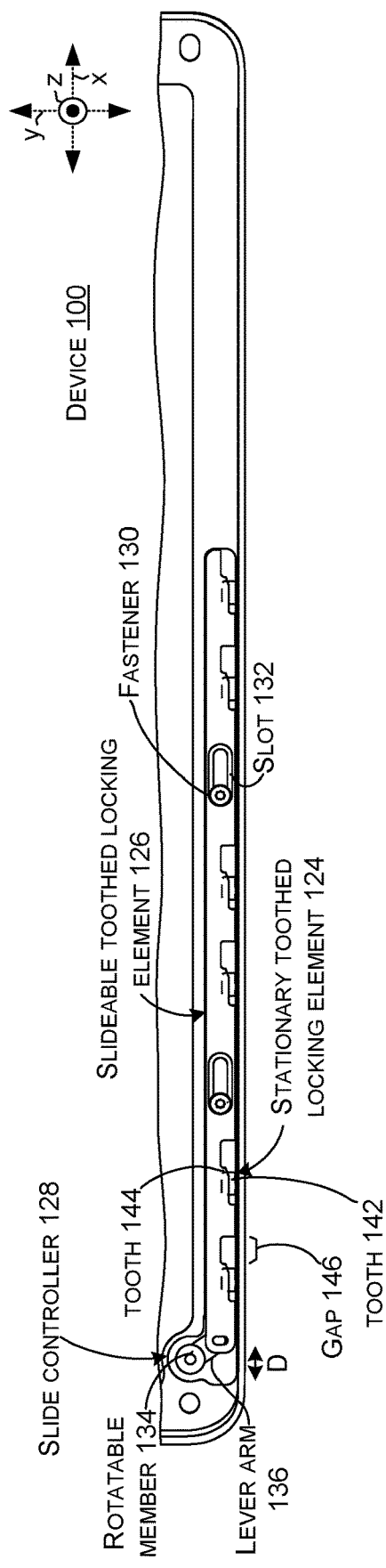

In this implementation, the stationary toothed locking element 124 includes spaced apart teeth 142 and the slidable toothed locking element 126 includes teeth 144 separated by gaps 146. Interactions of the teeth 142 and 144 can lock the first and second portions 102 and 104 together. FIGS. 1H, 1J, and 1L show the slidable toothed locking element 126 and the stationary toothed locking element 124 disengaged from one another (e.g., unlocked orientation) where the teeth 142 and 144 are not engaged (e.g., overlapping). FIGS. 1I, 1K, and 1M show the slidable toothed locking element 126 and the stationary toothed locking element 124 engaged with one another (e.g., locked orientation). As mentioned above, this locking or unlocking of the teeth 142 and 144 can be achieved by the user rotating the rotatable member 134 to rotate the lever arm 136. The rotation of the lever arm 136 can slide the slidable toothed locking element 126 distance D. Sliding the slidable toothed locking element 126 into engagement or out of engagement with the stationary toothed locking element 124 can lock or unlock the first and second portions 102 and 104.

Briefly, when the teeth 142 of the stationary toothed locking element 124 are aligned with gaps 146 of the slideable toothed locking element 126, the first and second portions 102 and 104 are unlocked and can be separated from one another. In contrast, when the teeth 142 of the stationary toothed locking element 124 are aligned (e.g., overlapping) with teeth 144 of the slideable toothed locking element 126, the first and second portions are locked and cannot be separated from one another.

The overlapping of teeth 142 with teeth 144 can also bias the first and second portions 102 and 104 toward one another and thereby reduce/eliminate any gaps between the first and second portions that might diminish the aesthetic appeal of the device 100 and/or allow contaminants to enter the enclosure 106. Thus, the stationary toothed locking element 124 and the slidable toothed locking element 126 can function as the gap reduction assembly 114. Toward this goal, the teeth 142 and/or 144 can have sloped or cammed surfaces 148 and 150, respectively. (See FIGS. 1L and 1M). In some implementations, the sloped surfaces 148 and 150 are neither parallel nor perpendicular to the z-reference direction. The sloped surfaces 148 and 150 can facilitate teeth 142 overriding and thus overlapping teeth 144 rather than bumping into them. Further, the sloped surfaces 148 and 150 can also force the first and second portions 102 and 104 toward one another as the slideable toothed locking element 126 engages the stationary toothed locking element 124.

To reiterate, for assembly, the first and second portions 102 and 104 can be brought toward one another so that the alignment pins 120 of the first portion 102 engage the pin receptacles 122 of the second portion 104. The engagement of the pins and the pin receptacles will precisely align the first and second portions 102 and 104. The rotatable member 134 can be engaged to slide the slideable toothed locking element 126 of the second portion 104 into engagement with the stationary toothed locking element 124 of the first portion 102. The engagement will force the first and second portions toward one another to reduce/eliminate gaps between the first and second portions in an aesthetically pleasing manner with aligned edges and corners and no gaps between the first and second portions.

In the event that a user desired to access enclosure 106, such as to service/replace components 107, the user can engage rotatable member 134 and rotate the rotatable member in the opposite direction from the assembly process. The rotatable member will in turn slide the slideable toothed locking element 126 of the second portion 104 out of engagement with the stationary toothed locking element 124 of the first portion 102. The teeth 142 of the stationary toothed locking element 124 of the first portion 102 are now aligned with gaps 146 between teeth 144 of the slideable toothed locking element 126 of the second portion 104 so the first and second portions can be separated from one another. There are no sacrificial elements to be replaced and reassembly can be completed in the same manner as the assembly described above.

Figure 2A:
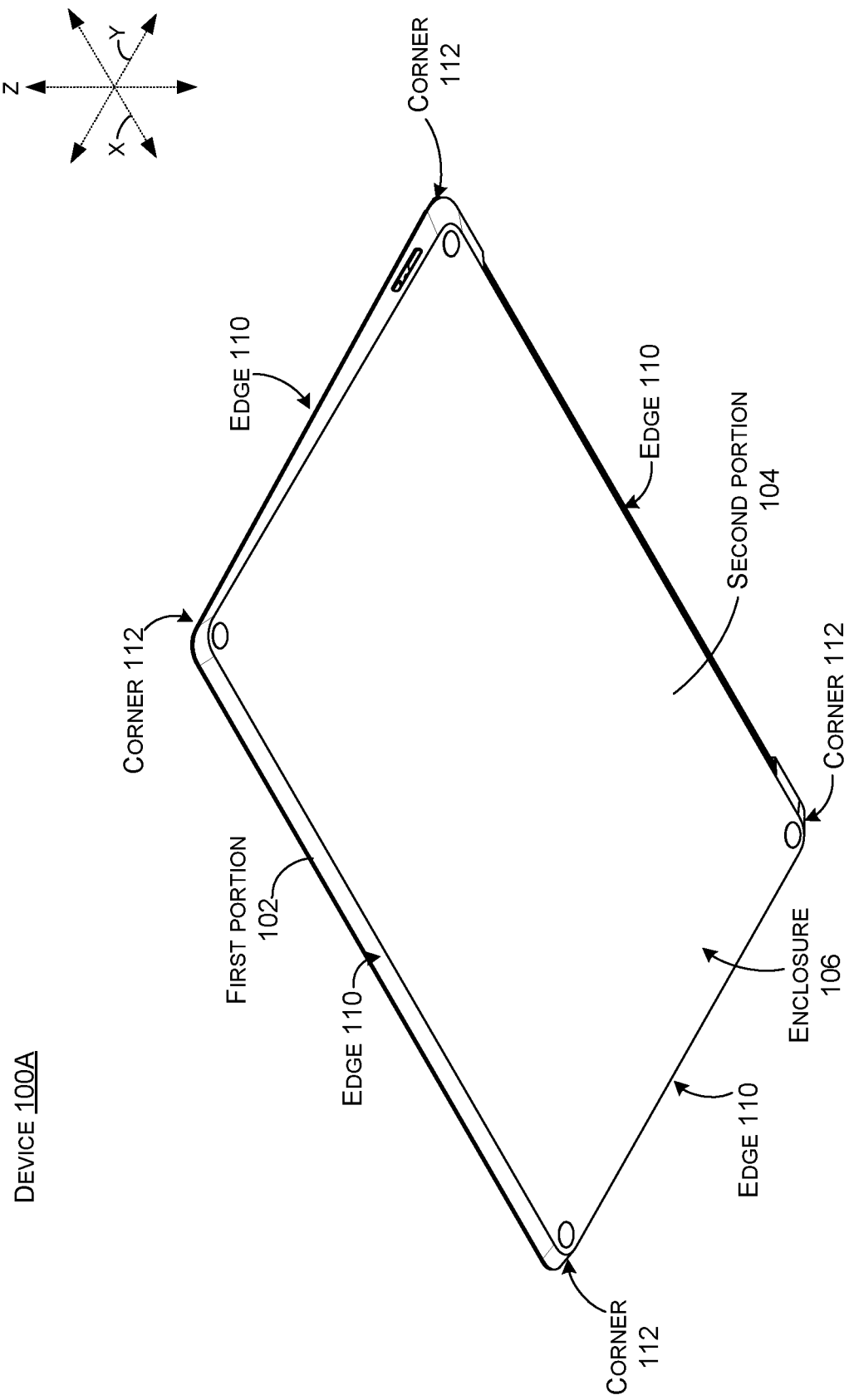
Figure 2B:
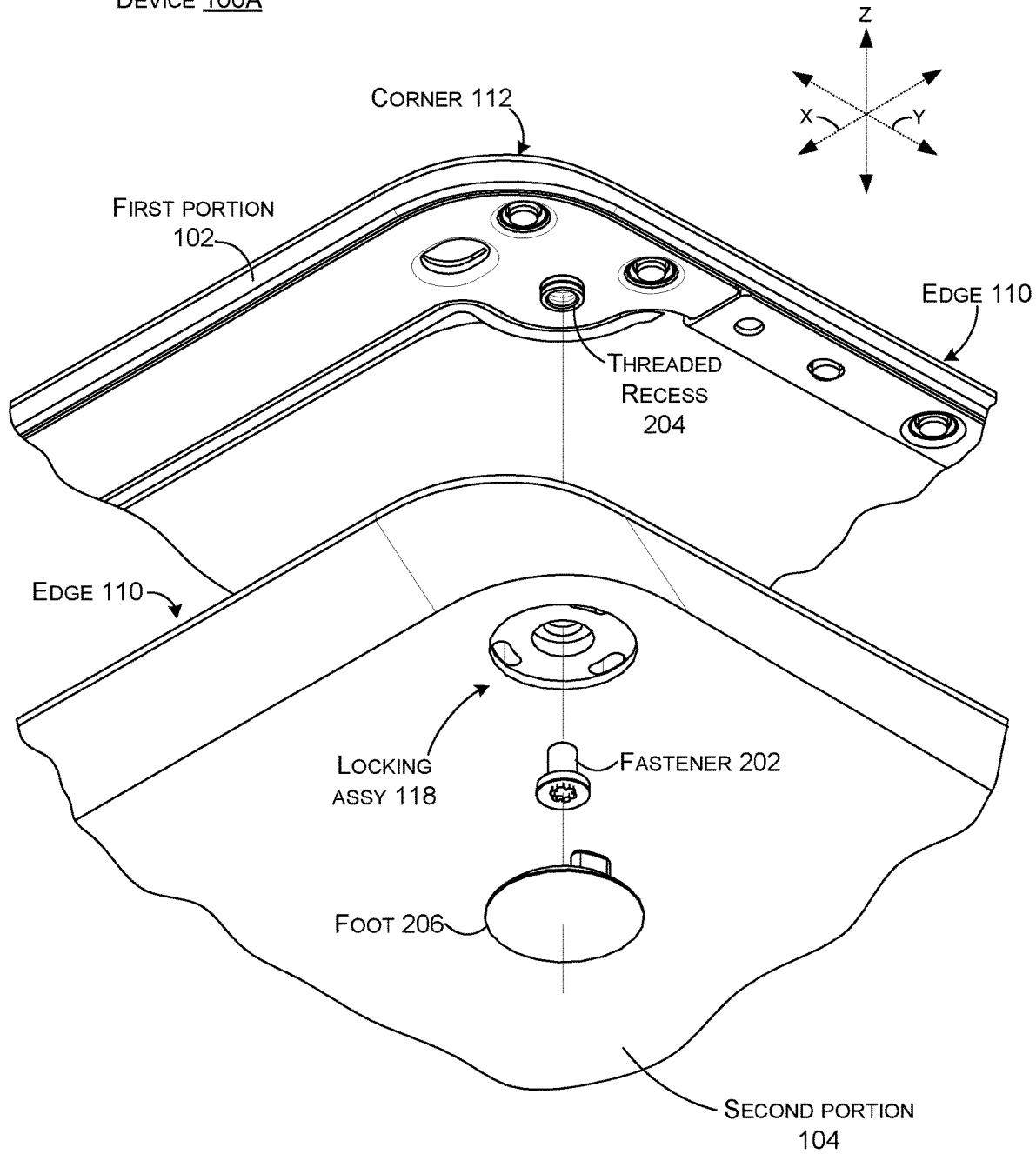
Figure 2C:
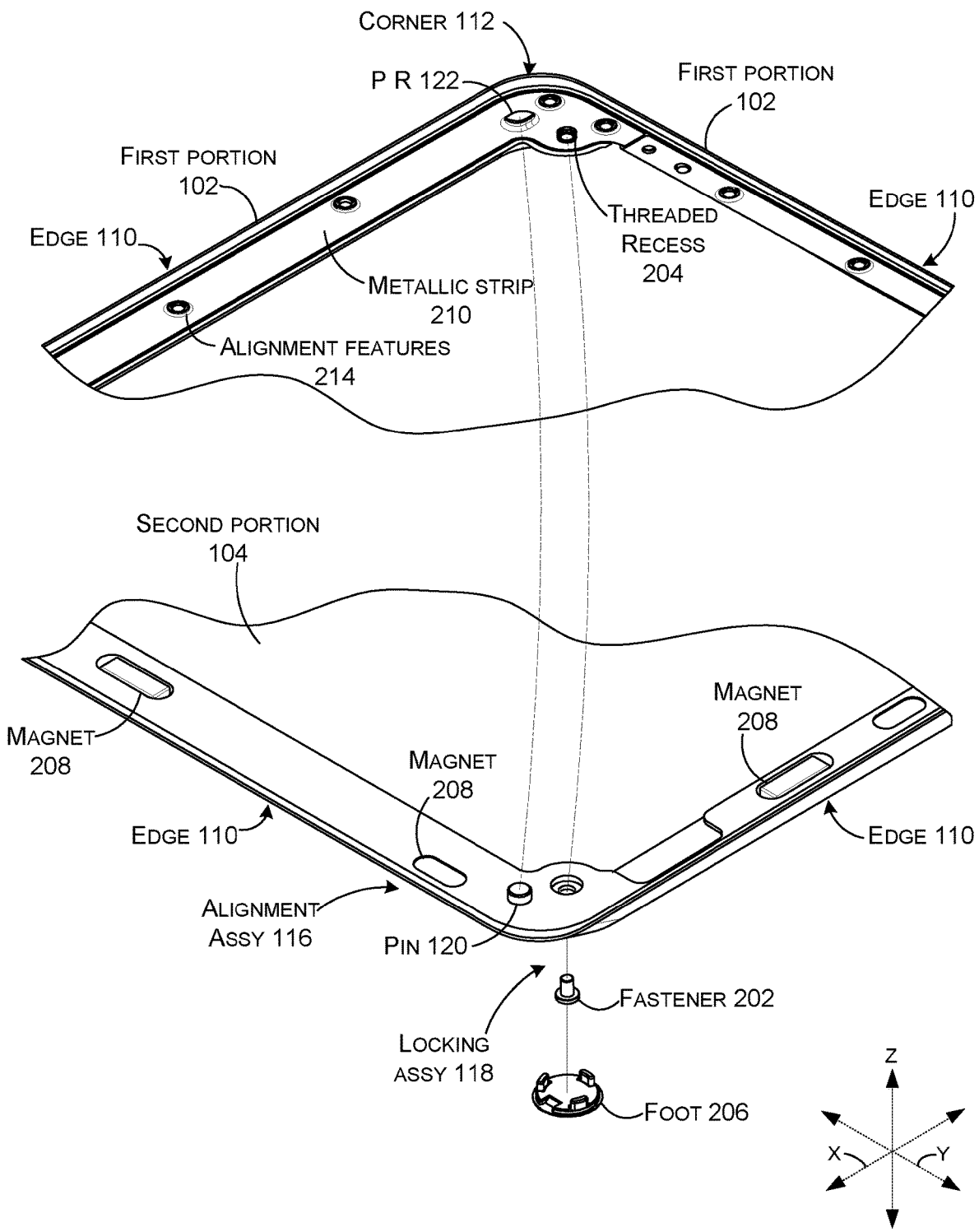
Figure 2D:
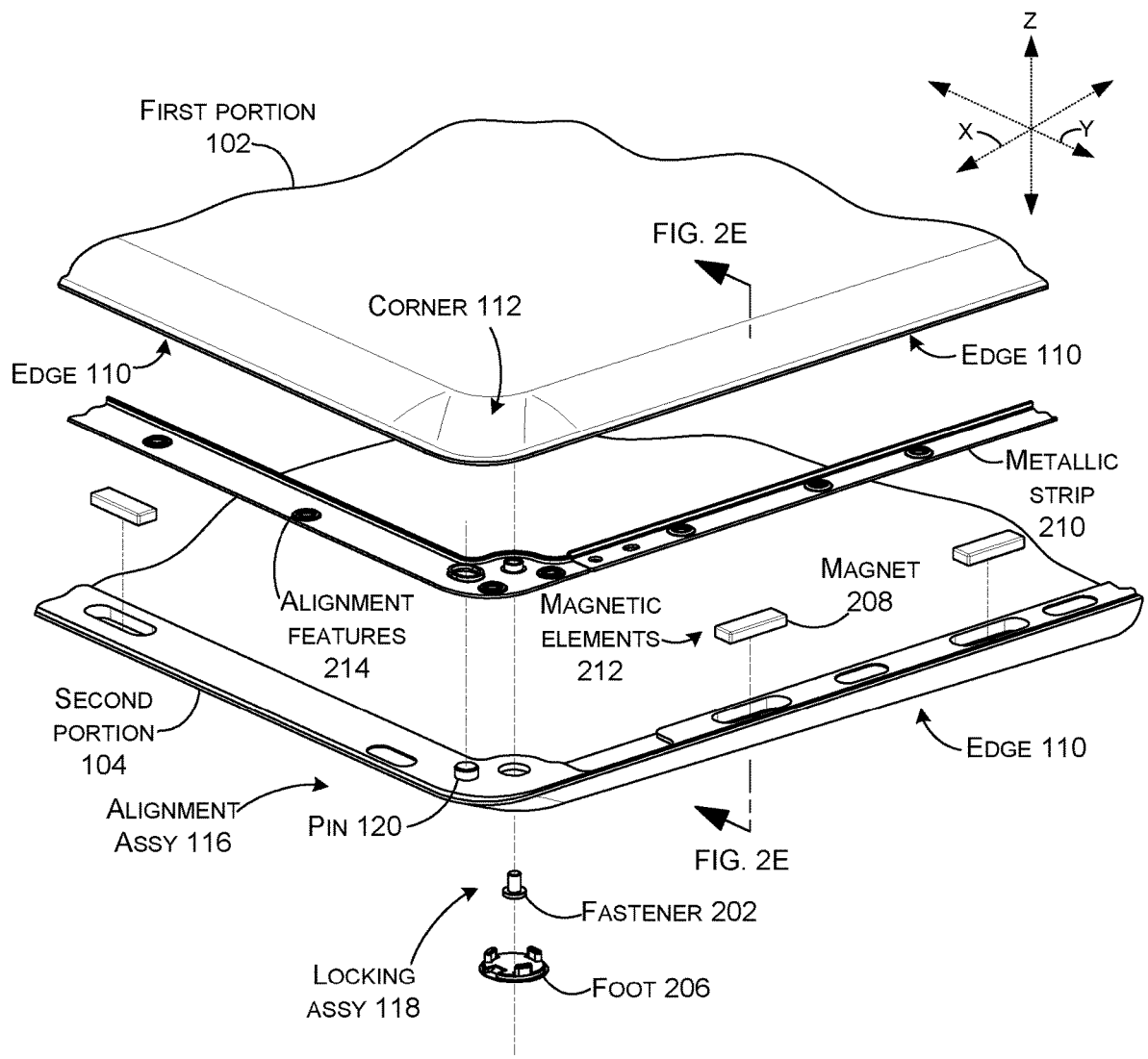
Figure 2E:
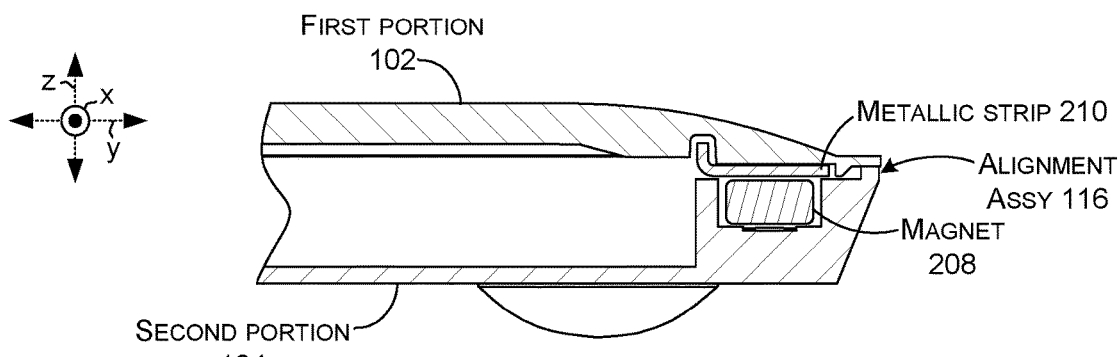

FIGS. 2A-2E collectively show features of another example device 100A manifest as a tablet type device. (The suffix 'A' indicates that some aspects of this device are different from those of device 100 described above relative to FIGS. 1A-1M. Elements introduced above relative to FIGS. 1A-1M are not re-introduced here for sake of brevity). FIG. 2A shows a perspective view of device 100A. FIGS. 2B-2D show exploded views of a region of device 100A. FIG. 2E shows a sectional view of the region of device 100A as indicated in FIG. 2D.

Example device 100A can include fastener 202, threaded recess 204, foot 206, magnet 208, ferrous metal strip (e.g., metallic strip) 210, magnetic elements 212, and/or alignment features 214. In this case, the alignment assembly 116 can include magnets 208 on the second portion 104 and metallic strips 210 on the first portion or vice versa. The magnets 208 can have various configurations. In the illustrated configuration, the magnets 208 are generally elongate along the edges 110. In other configurations, the magnets 208 could be round or square shaped, among others. The magnets 208 can be positioned on every edge of the second portion or less than all of the edges.

The magnets 208 and the metallic strips 210 can operate cooperatively as magnetic elements 212 that pull the first and second portions 102 and 104 toward one another in proper alignment (e.g., edges and corners aligned). The magnetic elements can also pull the first and second portions against one another to eliminate any gaps along the edges 110 and or corners 112.

The magnetic elements 212 can operate cooperatively with the alignment pins 120 and the pin receptacles 122 to ensure proper alignment of the first and second portions 102 and 104 as they are brought toward one another. For instance, the alignment pins 120 and pin receptacles 122 can be positioned on one or more corners 112 of the first and second portions 102 and 104, while the magnetic elements 212 are positioned along one or more edges 110. In one example, the magnetic elements are positioned on every edge 110, such as all four edges for a rectangularly-shaped device, and the alignment pins 120 are positioned on every corner 112, such as all four corners for a rectangularly-shaped device. Alternatively, the magnetic elements could be positioned on two opposing edges and the alignment pins on two corners; adjacent or diagonally opposing, for instance.

The magnetic elements 212 can exert a force to draw the first and second portions 102 and 104 toward one another and the alignment pins 120 and pin receptacles 122 can align the corners 112. The magnetic elements 212 can align the edges 110 and bias the edges 110 against one another and hence the first and second portions 102 and 104 against one another without gaps.

The magnetic elements 212 working cooperatively with the pins 120 and pin receptacles 122 will cause the device 100A to maintain this orientation due to the magnetic force, thus freeing the user to focus his/her attention to locking the first and second portions together via the locking assembly 116. Stated another way, the magnetic elements can secure the first and second portions together without the locking assembly (e.g., while the user installs/removes the fasteners 202). Thus, the magnetic elements 212 contribute to both the alignment functionality of the alignment assembly 116, and the gap reduction functionality of the gap reduction assembly 114, and/or the locking functionality of the locking assembly 118.

In this example the locking assembly 118 can be manifest as fastener 202 that passes through the first portion 102 and is received in a threaded recess 204 of the second portion 104 (or vice versa). The fastener 202 can be accessible to the user from the outside of the device 100. In this case, the fastener 202 can be accessed through an external surface of the second portion 104 by removing foot (e.g., cover) 206.

The user can readily assemble the device 100A by bringing the corners 112 of the first and second portions 102 and 104 toward one another. As the portions approach one another, magnetic force from the magnetic elements 212 will pull the portions toward one another in proper alignment. The pins 120 will engage the pin receptacles 122 to provide further precise alignment as the first and second portions contact one another. The device itself self-aligns and thus no special tools are required to achieve proper alignment of the first and second portions. The magnetic elements now bias the first and second portions toward one another to secure them together. The first and second portions will remain secured together while the user locks the first and second portions together with the fasteners 202 with a commonly available tool, such as a screwdriver. When finished, the user can install the feet 206 over the fasteners 202.

To disassemble, the user can remove the feet 206 and then the fasteners 202 with the screwdriver. The first and second portions 102 and 104 will not fall apart, but instead remain secured together by magnetic force until the user applies sufficient force to pull the first and second portions apart. No elements are damaged as a result of the disassembly. Service can be performed on the device as desired. The device can then be reassembled as described above.

To reiterate, the implementations described above can employ a gap reduction assembly 114 positioned along edges 110 of the first portion 102 and the second portion 104 to bias the first and second portions toward one another. The alignment assembly 116 can laterally aligns corners 112 and/or edges 110 of the first portion and the second portion. The gap reduction assembly 114 can bias the first and second portions against one another to eliminate any gaps therebetween. The locking assembly 118 can lock the aligned first and second portions together to avoid any unwanted disassembly, such when large forces are experienced in a dropping event. The user can readily assemble the first and second portions, disassemble the first and second portions, and reassemble with readily available tools and without damaging and/or replacing any elements of the gap reduction assembly 114, the alignment assembly 116, and/or the locking assembly 118.

The present concepts can be utilized with various types of user-serviceable dimensionally-constrained devices, such as computing devices that can include, but are not limited to, notebook computers, tablet type computers, smart phones, wearable smart devices, gaming devices, entertainment consoles, and/or other developing or yet to be developed types of devices. As used herein, a computing device can be any type of device that has some amount of processing and/or storage capacity and/or other heat generating components. A mobile computing device can be any computing device that is intended to be readily transported by a user.

Additional Examples

Various examples are described above. Additional examples are described below. One example includes a device comprising a first portion and a corresponding second portion and the first portion and the second portion each contributing to magnetic elements that bias edges of the first portion and edges of the second portion toward one another, the first portion and the second portion each contributing to an alignment assembly that laterally aligns corners of the first portion with corners of the second portion, and the first portion and the second portion each contributing to a locking assembly that secures the corners of the first portion and the corners of the second portion against one another.

Another example can include any of the above and/or below examples where the magnetic elements comprise elongate magnets positioned along multiple edges of the second portion and elongate ferrous metal strips along multiple edges of the first portion.

Another example can include any of the above and/or below examples where the elongate magnets are positioned along all of the edges of the second portion or wherein the elongate magnets are positioned along less than all of the edges of the second portion.

Another example can include any of the above and/or below examples where the magnetic elements further comprise a gap reduction assembly that biases the edges of the first portion against the edges of the second portion to eliminate gaps between the first and second portions.

Another example can include any of the above and/or below examples where the magnetic elements secure the first portion to the second portion even without the locking assembly.

Another example can include any of the above and/or below examples where the alignment assembly comprises an alignment pin extending from a corner of the second portion and a corresponding pin receptacle formed in a corresponding corner of the first portion.

Another example can include any of the above and/or below examples where the alignment assembly further comprises the magnetic elements working cooperatively with the alignment pin and the pin receptacle.

Another example can include any of the above and/or below examples where the alignment pin comprises alignment pins extending from multiple corners of the second portion and the pin receptacle comprises pin receptacles in multiple corners of the first portion.

Another example can include any of the above and/or below examples where the alignment pins extend from each of the corners of the second portion, or wherein the alignment pins extend from less than all of the corners of the second portion.

Another example includes a device comprising a first portion having at least two opposing edges that include a stationary toothed locking element and second portion that corresponds to the first portion, the second portion comprising a slideable toothed locking element and a slide controller that can slide the slideable toothed locking element into engagement with the stationary toothed locking element to secure the first portion and the second portion against one another and slide the slideable toothed locking element to disengage the stationary toothed locking element to allow the first portion and the second portion to be separated from one another.

Another example can include any of the above and/or below examples where the slide controller includes an interface that is accessible from an outside surface of the second portion.

Another example can include any of the above and/or below examples where the interface is formed on a rotatable member that is coupled to the slideable toothed locking element by an anti-binding element.

Another example can include any of the above and/or below examples where the rotatable member includes a lever arm that is coupled to the slideable toothed locking element by the anti-binding element.

Another example can include any of the above and/or below examples where the anti-binding element is a bearing.

Another example can include any of the above and/or below examples where the first portion and the second portion each contribute to an alignment assembly that laterally aligns corners of the first portion and corners of the second portion with one another.

Another example can include any of the above and/or below examples where the alignment assembly comprises pins in each corner of the second portion and pin receptacles in each corner of the first portion, or wherein the alignment assembly comprises pins in less than all of the corners of the second portion and pin receptacles in less than all corners of the first portion.

Another example can include any of the above and/or below examples where teeth of at least one of the stationary toothed locking element and the slideable toothed locking element comprise a sloped surface for engaging teeth of the other of the stationary toothed locking element and the slideable toothed locking element.

Another example includes a device comprising a first portion and a corresponding second portion, a gap reduction assembly positioned along edges of the first portion and the second portion and that biases the first and second portions toward one another, an alignment assembly that laterally aligns corners of the first portion and the second portion, and a locking assembly that locks the laterally aligned corners of the first portion and the second portion against one another.

Another example can include any of the above and/or below examples where the gap reduction assembly and the locking assembly comprise a stationary toothed locking element in the first portion and a slideable toothed locking element in the second portion.

Another example can include any of the above and/or below examples where the gap reduction assembly comprises elongate magnets positioned along the edge of the first portion and a metallic strip positioned along the edge of the second portion.

CONCLUSION

Although techniques, methods, devices, systems, etc., pertaining to user-serviceable dimensionally-constrained devices are described in language specific to structural features and/or methodological acts, it is to be understood that the subject matter defined in the appended claims is not necessarily limited to the specific features or acts described. Rather, the specific features and acts are disclosed as example forms of implementing the claimed methods, devices, systems, etc.

The invention claimed is:

1. A device, comprising:
   a first portion that includes a keyboard and a touchpad and a corresponding underlying second portion, both the first portion and the second portion having edges extending between corners; and,
   the first portion and the second portion each contributing to magnetic elements that bias the edges of the first portion and the edges of the second portion toward one another,
   the first portion and the second portion each contributing to an alignment assembly that includes alignment pins in the corners of the first portion that automatically laterally align with pin receptacles in the corners of the second portion as the first and second portions are automatically biased toward one another by the magnetic elements, and,
   the first portion and the second portion each contributing to a locking assembly that secures the corners of the first portion and the corners of the second portion against one another via fasteners that extend through recesses in the corners of the first portion adjacent to the alignment pins and are received in threaded recesses of the second portion, the recesses and the threaded recesses being automatically aligned to receive the fasteners by the alignment pins and the pin receptacles.

2. The device of claim 1, wherein the magnetic elements comprise elongate magnets positioned along multiple edges of the second portion and elongate ferrous metal strips along multiple edges of the first portion.

3. The device of claim 2, wherein the elongate magnets are positioned along all of the edges of the second portion or wherein the elongate magnets are positioned along less than all of the edges of the second portion.

4. The device of claim 1, wherein the magnetic elements further comprise a gap reduction assembly that biases the edges of the first portion against the edges of the second portion to eliminate gaps between the first and second portions.

5. The device of claim 1, wherein the magnetic elements secure the first portion to the second portion even without the locking assembly.

6. The device of claim 1, wherein individual alignment pins are adjacent to individual fasteners in individual corners.

7. The device of claim 6, wherein the alignment assembly further comprises the magnetic elements working cooperatively with the alignment pins and the pin receptacles.

8. The device of claim 7, wherein the alignment pins extend from each corner of the first portion and the pin receptacles extend from each corner of the second portion.

9. The device of claim 8, wherein the magnetic elements and the alignment assembly automatically align and hold the first and second portions together without the fasteners.

10. A device, comprising:
a first portion and a corresponding second portion that both have edges extending between corners; and,
the first portion including a touchpad facing away from the second portion and a metal strip facing toward the second portion;
the metal strip interacting with magnets in the second portion to bias the edges of the first portion and the edges of the second portion toward one another,
the first portion and the second portion each contributing to an alignment assembly that includes alignment pins in the corners of the second portion that automatically laterally align with pin receptacles in the metal strip as the first and second portions are biased toward one another by magnetic elements in the second portion and the metal strip in the first portion, and,
fasteners that extend through the corners of the second portion adjacent to the alignment pins and are received in the metal strip to secure the first and second portions together.

11. The device of claim 10, wherein the metal strip extends along all of the edges and all of the corners of the first portion.

12. The device of claim 11, wherein the metal strip contacts both the first portion and the second portion.

13. The device of claim 11, wherein the metal strip comprises a single metal strip that extends around an entirety of a perimeter of the first portion.

14. The device of claim 10, wherein the magnetic elements and fasteners secure the first and second portions together without adhesive.

15. The device of claim 10, wherein the fasteners are recessed in the second portion.

16. The device of claim 15, further comprising feet that are removably secured to the second portion over the fasteners.

17. A mobile computing device, comprising:
a first portion that defines an upper side that includes an input device and a lower side that faces a second portion, the lower side comprising a metal strip extending around at least a portion of a periphery of the first portion,
the second portion comprising magnets that engage the metal strip to bias a periphery of the second portion toward the periphery of the first portion,
the second portion comprising alignment pins that engage pin receptacles in the metal strip and adjacent fasteners that extend through the second portion into recesses in the metal strip, and wherein the fasteners are recessed in the second portion and covered by removeable feet.

18. The mobile computing device of claim 17, further comprising a processor positioned between the upper side and the lower side of the first portion.

19. The mobile computing device of claim 17, wherein the metal strip comprises a single metal strip that extends around an entirety of the periphery of the first portion.

20. The mobile computing device of claim 17, wherein the metal strip contacts both the first portion and the second portion and the fasteners compress the first portion and the second portion together against the metal strip.

* * * * *